(12) United States Patent
Lustig et al.

(10) Patent No.: US 11,402,446 B2
(45) Date of Patent: Aug. 2, 2022

(54) SINGLE SCREEN FABRICATION OF SYMMETRIC MULTILAYER MAGNETIC RESONANCE IMAGING (MRI) RECEIVE COILS

(71) Applicant: The Regents of the University of California, Oakland, CA (US)

(72) Inventors: Shimon Michael Lustig, Moraga, CA (US); Ana Claudia Arias, Layfayette, CA (US); Joseph R. Corea, Berkeley, CA (US); Anita M. Flynn, Oakland, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 16/564,306

(22) Filed: Sep. 9, 2019

(65) Prior Publication Data
US 2020/0072918 A1    Mar. 5, 2020

Related U.S. Application Data

(63) Continuation of application No. PCT/US2018/021820, filed on Mar. 9, 2018.
(Continued)

(51) Int. Cl.
*G01R 33/34*       (2006.01)
*G01R 33/3415*    (2006.01)

(52) U.S. Cl.
CPC ... *G01R 33/34007* (2013.01); *G01R 33/3415* (2013.01)

(58) Field of Classification Search
None
See application file for complete search history.

(56) References Cited

U.S. PATENT DOCUMENTS 5,548,218 A    8/1996   Lu
6,927,575 B2   8/2005   Burl et al.
(Continued)

FOREIGN PATENT DOCUMENTS

WO    WO 2016/081844 A1    5/2016

OTHER PUBLICATIONS

Corea, J. R. et al. Screen-printed flexible magnetic resonance imaging receive coils. Nat. Commun. 7:10839 doi: 10.1038/ncomms10839 (2016) (Year: 2016).*
(Continued)

*Primary Examiner* — Jose I Hernandez-Kenney
(74) *Attorney, Agent, or Firm* — Leydig, Voit & Mayer, Ltd.

(57) ABSTRACT

Methods for forming flexible magnetic resonance imaging (MRI) receive coil devices having at least one receive coil with at least one capacitor are provided and include providing a flexible substrate having a first surface and a second surface opposite the first surface, forming a first conductor pattern on the first surface by printing a first layer of conductive material on the first surface using a printing mask having a pattern, and forming a second conductor pattern on the second surface by printing a second layer of conductive material on the second surface using the same printing mask or identical printing mask, wherein a portion of the first conductor pattern on the first surface overlaps with a portion of the second conductor pattern on the second surface with the flexible substrate therebetween to form the at least one capacitor element.

11 Claims, 5 Drawing Sheets

Related U.S. Application Data

(60) Provisional application No. 62/469,253, filed on Mar. 9, 2017.

(56) References Cited

U.S. PATENT DOCUMENTS

| | | |
|---|---|---|
| 7,031,763 B1 | 4/2006 | Zhang |
| 7,365,542 B1 | 4/2008 | Rohling et al. |
| 7,619,416 B2 | 11/2009 | Nordmeyer-Massner et al. |
| 7,663,367 B2 | 2/2010 | Wiggins |
| 8,487,620 B2 | 7/2013 | Brown et al. |
| 9,000,766 B2 | 4/2015 | Chu et al. |
| 9,002,431 B2 | 4/2015 | Jones |
| 9,081,067 B2 | 7/2015 | Schellekens et al. |
| 9,255,977 B2 | 2/2016 | Biber et al. |
| 9,696,393 B2 | 7/2017 | Arias et al. |
| 2013/0271143 A1 | 10/2013 | Vester |
| 2014/0210466 A1* | 7/2014 | Arias ............... G01R 33/34084 324/309 |

OTHER PUBLICATIONS

International Search Report in International Patent Application No. PCT/US2018/021820 dated May 14, 2018.
Corea, J et al. "Screen-printed flexible MRI receive coils" Nature Comm. 7, No. 10839 (2016), Mar. 10, 2016.

\* cited by examiner

A

B

Plastic Substrate Coil

Copper coil with loss capacitors

SINGLE SCREEN FABRICATION OF SYMMETRIC MULTILAYER MAGNETIC RESONANCE IMAGING (MRI) RECEIVE COILS

CROSS-REFERENCE TO RELATED APPLICATIONS

This Patent Application is a continuation of PCT Application No. PCT/US2018/021820 by Lustig et al., entitled "SINGLE SCREEN FABRICATION OF SYMMETRIC MULTILAYER MAGNETIC RESONANCE IMAGING (MRI) RECEIVE COILS," filed Mar. 9, 2018, which claims priority to U.S. Provisional Patent Application No. 62/469,253 by Lustig et al., entitled "SINGLE SCREEN FABRICATION OF SYMMETRIC MULTILAYER MAGNETIC RESONANCE IMAGING (MRI) RECEIVE COILS," filed Mar. 9, 2017, each of which is incorporated herein by reference in its entirety.

STATEMENT REGARDING FEDERALLY SPONSORED RESEARCH AND DEVELOPMENT

This invention was made with Government support under Grant Numbers EB015628 and EB019241, both awarded by the National Institute of Health. The Government has certain rights in this invention.

BACKGROUND

In Magnetic Resonance Imaging (MRI), very small signals are created via excitation of hydrogen protons in the bore of an MRI machine. These signals are picked up on receiver coils adjacent to the patient inside the machine and processed to yield an image. The higher the signal-to-noise (SNR) the receiver coils can produce, the faster the scan time can be and the higher the quality of images that can be produced. MRI receiver coil arrays provide a better signal-to-noise-ratio and field of view over standard single coil receivers. However, this gain is lost when the surface coil array is at an improper distance from the patient.

Currently, most coils today have a rigid or semi-rigid structure and are one-size-fits-all, whereas patients come in a variety of sizes and shapes.

There is therefore a need for MRI receiver coil devices that provide increased SNR, and which provide improved patient conformity. There is also a need for cost-effective fabrication processes for forming such receiver coil devices as well as other devices that have at least a partially symmetric nature.

SUMMARY

The present disclosure provides MRI receiver coil devices, including MRI receiver coils arrays and method for manufacturing the same.

According to an embodiment, a method of forming a flexible magnetic resonance imaging (MRI) receive coil device having at least one receive coil with at least one capacitor is provided. The method typically includes providing a flexible substrate having a first surface and a second surface opposite the first surface, forming a first conductor pattern on the first surface by printing a first layer of conductive material on the first surface using a printing mask having a pattern, and forming a second conductor pattern on the second surface by printing a second layer of conductive material on the second surface using said printing mask, wherein a portion of the first conductor pattern on the first surface overlaps with a portion of the second conductor pattern on the second surface with the flexible substrate therebetween to form the at least one capacitor. In certain aspects, printing includes screen printing and the mask includes a screen printing mask.

According to another embodiment, a method of forming a flexible magnetic resonance imaging (MRI) receive coil device having at least one receive coil with at least one capacitor is provided. The method typically includes providing a flexible substrate having a first surface and a second surface opposite the first surface, providing a screen printing mask having a mask pattern, screen printing a first layer of conductive material on the first surface using the screen printing mask to form a first conductor pattern on the first surface, and screen printing a second layer of conductive material on the second surface using the screen printing mask to form a second conductor pattern on the second surface, wherein the mask pattern is arranged such that a portion of the first conductor pattern overlaps with a portion of the second conductor pattern with the flexible substrate therebetween to form the at least one capacitor.

According to yet another embodiment, a flexible magnetic resonance imaging (MRI) receive coil device is provided, which is formed according to any of the methods herein.

In certain aspects, the flexible substrate comprises a dielectric plastic material selected from the group consisting of a polyimide (PI) film, a polyethylene terephthalate (PET) film, a polyethylene naphthalate (PEN) film, a polyetherimide (PEI) film, a polytetrafluoroethylene (PTFE) film, a polyaryletherketone (PAEK) material film and a poly ether ketone (PEEK) film. In certain aspects, the receive coil device includes two or more capacitors, and wherein separated portions of the first conductor pattern on the first surface overlap with separated portions of the second conductor pattern on the second surface with the flexible substrate therebetween to form the two or more capacitors. In certain aspects, the receive coil device includes four capacitors. In certain aspects, the method further includes iteratively repeating steps one or more times to form a flexible MRI receiver coil device having an array of two or more receive coils, wherein for each iteration, a position of the printing mask is adjusted relative to the flexible substrate so that each subsequent receive coil formed is offset relative to a previous receive coil formed. In certain aspects, the conductive material comprises a conductive ink. In certain aspects, the conductive ink includes a metal material selected from the group consisting of gold, copper and silver. In certain aspects, the metal material comprises metallic flakes. In certain aspects, a method further includes annealing the flexible substrate after each conductor pattern has been formed on the flexible substrate.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE SEVERAL VIEWS OF THE DRAWING(S)

The detailed description is described with reference to the accompanying figures. The use of the same reference numbers in different instances in the description and the figures may indicate similar or identical items.

FIG. 1: FIG. 1A illustrates a pattern printed on a front side of a substrate; FIG. 1B illustrates the substrate flipped over and printed with the same pattern on the backside, wherein areas of overlap form capacitors and the remainder of the conductive lines form the overall form of the device; FIG. 1C illustrates processing repeated to form an array of patterns; and FIG. 1D shows repetition of patterning repeated an arbitrary length, according to an embodiment.

DETAILED DESCRIPTION

The following detailed description is exemplary in nature and is not intended to limit the invention or the application and uses of the invention. Furthermore, there is no intention to be bound by any expressed or implied theory presented in the following detailed description or the appended drawings.

Figure 1:
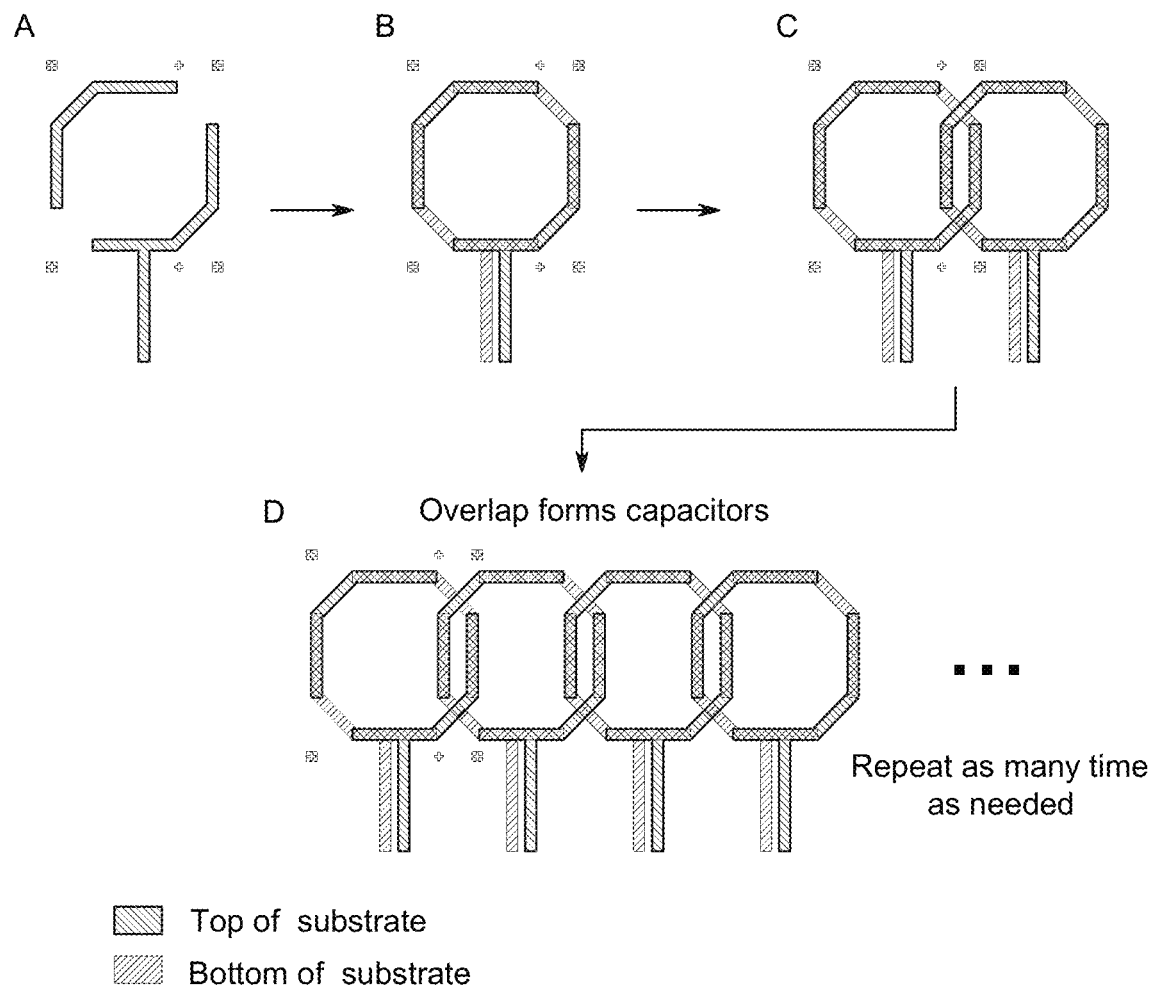
Figure 2:
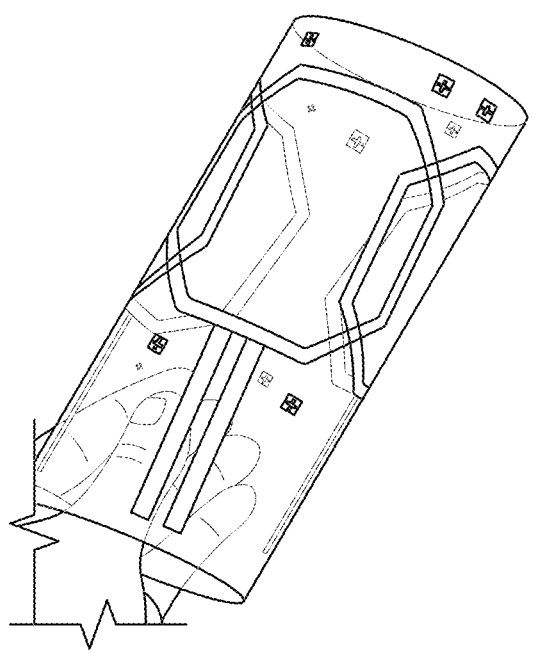
FIG. 2A illustrates a printed array fabricated using a symmetric designaccording to the present disclosure.
FIG. 2B illustrates a cross-section summery of a printing process according to an embodiment.
Figure 2:
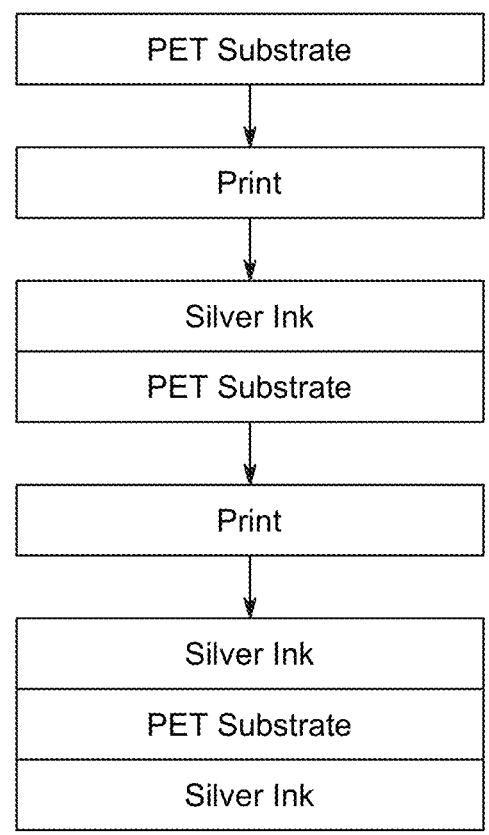
Figure 4:
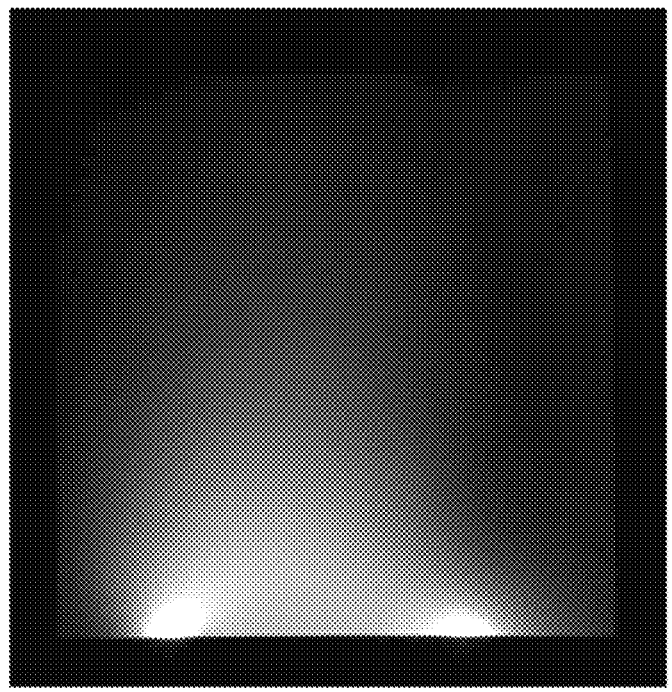
FIG. 4 shows a comparison of MRI scans of salt water phantom at 3T of symmetrically designed substrate coil (left) and a traditionally made coil (50 micron copper with low loss porcelain capacitors; right); both show similar performance.
Figure 4:
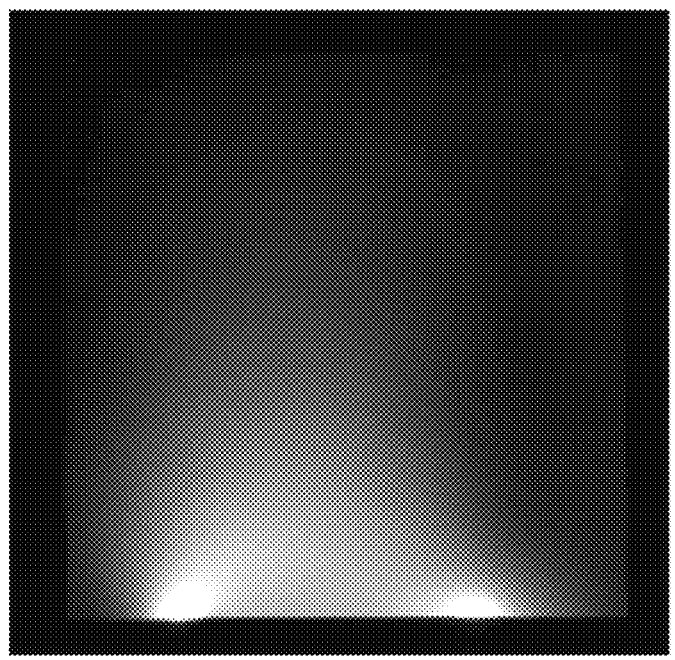

According to various embodiments, a single screen or mask is used to produce a MRI scanner receive coil array. The production cost of a screen-printed device depends on the complexity of the device. With each different processing layer, a unique pattern is desired which requires a unique mask. A set of several expensive masks is traditionally needed to take a device from start to finish. However, according to an embodiment, using a symmetric design, a single screen can advantageously be used for multiple processing layers. According to various embodiments, a pattern (simple or complex) can be built up by simply repeating the pattern over and over again as is shown in FIG. 1 and FIG. 2. A prototype coil array made according to an embodiment, and preliminary scan images are shown in FIG. 2 and FIG. 4, respectively.

Coil Fabrication

Figure 5:
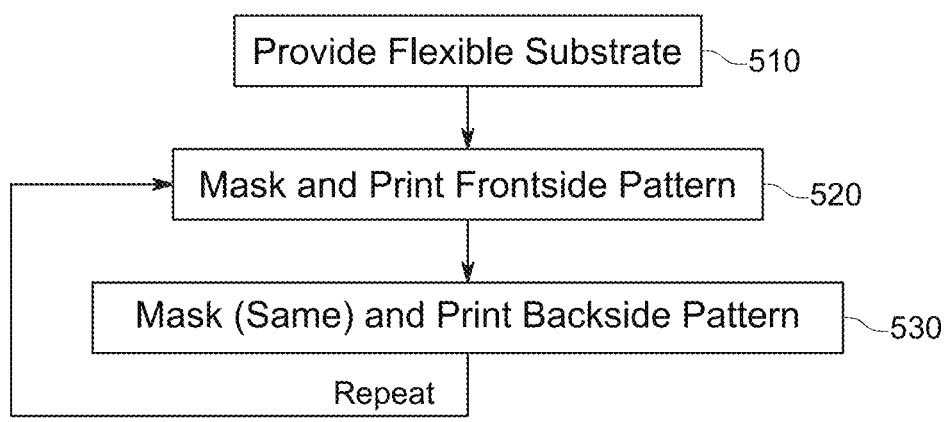
FIG. 5 illustrates a method of forming a flexible MRI receive coil device according to an embodiment.

FIG. 5 illustrates a method 500 of forming a flexible MRI receive coil device according to an embodiment. In step 510, a substrate is provided. In certain embodiments, the substrate includes a thin, flexible material, such as a film. The substrate films are preferably flexible, but may include rigid or semi-rigid materials. Examples of useful substrate materials include PET (Polyethylene terephthalate), Kapton (polyimide), PEN (Polyethlye napthaline), PEEK (Polyether ether ketone), PI (polyimide), PEI (polyetherimide), PTFE (polytetrafluoroethylene), PAEK (polyaryletherketone), (PES) Polyethersulphone, other polymer, materials, and other flexible or non-flexible materials. Prior to printing, the substrate may be preheated to the temperature seen during annealing to relieve any stress and prevent distortion in future processing steps. The substrate is then allowed to cool to room temperature before proceeding onto the printing process.

In step 520, a layer of conductive material is printed or applied on the frontside of the substrate to form a conductor pattern as defined by the patterning mask used (e.g., screen printing mask, or other mask depending on the material application process used). In step 530, the substrate is flipped and a layer of conductive material is printed or applied on the backside of the substrate to form a conductor pattern as defined by the same patterning mask. Of note, the same patterning mask is used in certain embodiments for both steps 520 and 530. For example, for a screen printing embodiment, printing the conductive layers is accomplished by masking the substrate and screen-printing conductive material (e.g., conductive ink such as silver microflake ink) onto the substrate followed by an anneal (e.g., a 125° C. anneal for 15 min). After that, the overturned substrate is loaded back into the screen printer to receive the same patterning on the backside. A schematic of processing steps and pattern build up are shown in FIG. 1 and FIG. 2B, respectively. As shown in FIG. 1B, the patterning on the frontside and the backside are complementary, so as to form overlap areas that define capacitors in the embodiment shown. The amount of overlap, or amount of offset between frontside and backside patterns, may be designed into the mask itself, and/or an offset may be applied in the backside printing relative to the frontside print. Steps 520 and 530 may be iteratively repeated as desired to build up an array of device, for example as shown in FIG. 1C and FIG. 1D. In an embodiment, when iteratively repeating steps 520 and 530 one or more times to form a device, such as a flexible MRI receiver coil device having an array of two or more receive coils, for each iteration, a position of the printing mask is adjusted relative to the flexible substrate so that each subsequent receive coil formed is offset relative to a previous receive coil formed. Also, different masks may be used at different iteration as desired to form more complex devices and/or devices with different components.

A prototype coil array made according to an embodiment, and preliminary scan images are shown in FIG. 2 and FIG. 4, respectively.

Figure 3:
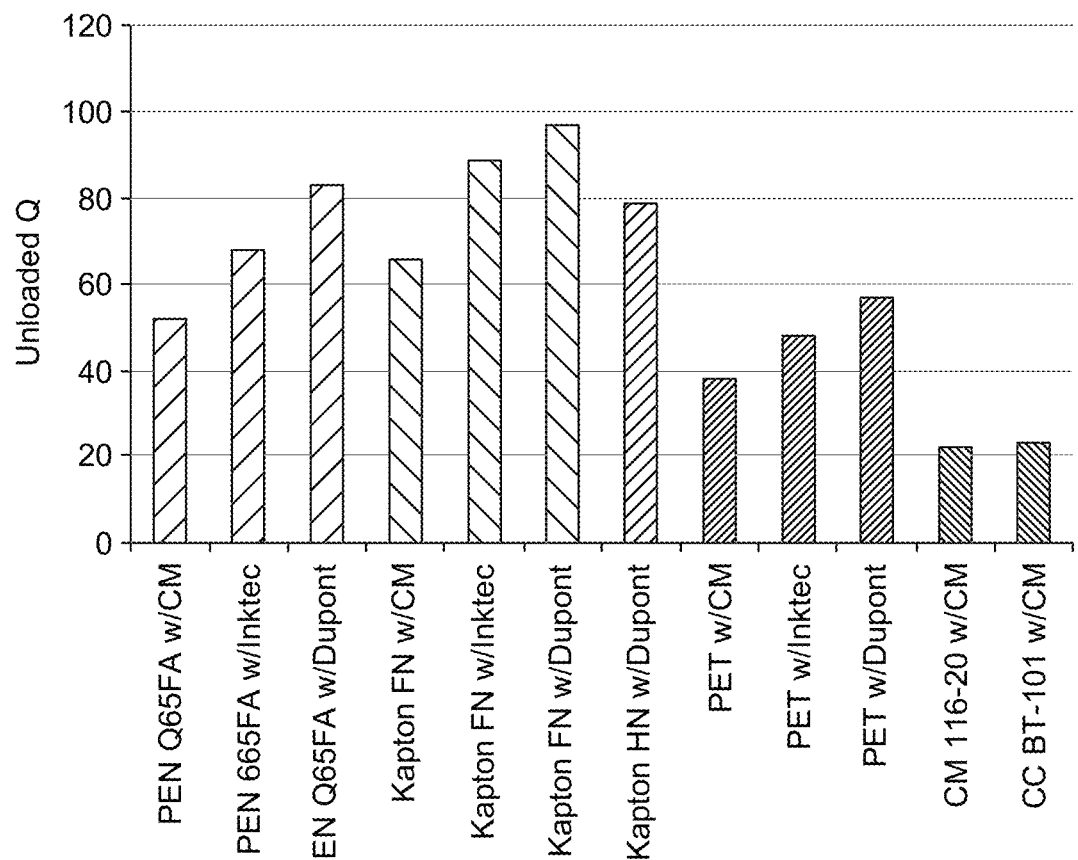
FIG. 3 shows unloaded Q values for MRI coils created with a symmetric pattern using various substrate materials according to various embodiments.

The various embodiments also take advantage of the excellent dielectric properties of the substrate materials. FIG. 3 shows examples of unloaded Q values for devices formed using various substrate materials according to various embodiments.

As a proof of concept, a fully printed MRI receive coil array device was created using only one screen (MRI scans using the coil array device shown in FIG. 4), printing on both sides of the substrate using a symmetric design. The device's pattern is mirrored front and back, allowing only one screen to be used in the fabrication of a Printed MRI Receive array greatly increasing throughput, lowering cost, and simplifying production. Subsequent elements/patterns to create an array are created by shifting the entire pattern over a set amount as determined by the screen geometry (see, e.g., FIG. 1 and FIG. 2).

If additional complexity is still needed (i.e., a different ink or device), a second symmetric screen can be incorporated to once again reduce the number of patterns needed in half.

Devices according to the present embodiments use high-quality flexible substrates to make superior printed MRI coils compared to those utilizing a printed dielectric. Printed Flexible MRI receiver coils and arrays create a higher Signal-to-Noise Ratio (SNR) on more body types and physiologies than traditional inflexible coils because of their ability to intimately conform to many types of physiologies.

In certain embodiments, printed flexible receive coils arrays for MRI scanners are fabricated using additive solution processing techniques to print (form) conductors, insulators, capacitors, inductors, transmission lines and other discrete devices needed for their proper function.

Coils can be fabricated on several flexible and conformal substrates such as plastic films, mesh, and cloth. Printed receiver coils can be made into tailored garments.

In one embodiment, screen printing is used to print the coil arrays. This takes advantage of the benefits of high throughput, thick films for good conductivity, large area of coverage, and low cost screen printing offers compared to traditional fabrication techniques. Other printing techniques may be used, e.g., roto-gravure, stamp, flexographic, etc. techniques In certain embodiments, an entire MRI receive coil device is printed, which allows for the entire array to be thin (e.g., less than 0.1 mm) allowing for a new level of conforming to the patient. Coils with integrated components according to various embodiments have fewer interfaces between discrete packages thus making them less prone to failure with use. Coils according to various embodiments can be tuned for human scanning systems, e.g., specifically 1.5T, 3T, but can easily be adapted for 7T or other possible systems.

Advantages and Utility

With each individual screen needed in a printing process, complexity is increased, adding to the overall cost. Mask storage, cleaning, and lifetime tracking grows with each new screen added. A symmetric pattern allows for only one screen to be used in an entire process flow. This greatly increases manufacturing throughput since the screen need not be changed out, removing a significant portion of downtime.

Using the substrate as an electrically active layer (e.g., using it as a dielectric for printed capacitors) allows for higher quality components to be produced than building the components using only printed inks (see, e.g., FIG. 1). In the case of the MRI Receive coil devices according to the present embodiments, high quality of images and fast scan times are achieved, regardless of patient body type.

The techniques of symmetric design to reduce the number of masks as disclosed herein can be used in any screen-printing, roto-gravure, stamp, or flexographic technique where mask cost, cleaning, and upkeep are significant portions of production cost.

Using a symmetric design with only one screen allows rapid processing of a device without needing a separate printing tool or changing out tooling, greatly increasing throughput.

These symmetric printed coils have been made for common MRI 3T human scanners and can easily be adapted to higher and lower field systems.

The coils of the present embodiments interface in the same way other traditional surface coils interface with the scanner requiring little to no retrofitting of existing equipment for their use.

Utilizing one screen to create an entire array greatly simplifies processing, increases throughput, and allows the use of high quality dielectrics.

Patterns should be symmetric or mirrored about the axis of the substrate. Some patterns may be more easily adaptable to this technique than others, for example, capacitors are an excellent application, while some non-symmetric antennas would possibly require additional steps.

Many different substrates can be printed on, allowing for a wide area of possible adaptations.

Flexible coil arrays with printed components allow for a higher degree of integration than currently attained by coils that are made up of discrete off the shelf components.

Current inflexible coils use high quality discrete components and high conductivity copper traces to increase the quality of images. However this advantage degrades as the coils are moved away from the area or type of body they were designed for since they are no longer conformal.

Current coil manufacturing uses off-the-shelf discrete components, requiring rigid contacts and soldering points which are prone to mechanical failure. Fabricating an integrated flexible system where all components are printed, as disclosed herein, advantageously helps eliminate failures and provides better flexibility and conformity, thus improving both SNR and lifetime of devices.

Printed flexible surface coil arrays, such as ones used for pediatric patients and adult knees, ankles, shoulders or other. A conformal coil that fits well to convoluted body anatomy can lead to significant SNR gains—as high as 2× or 3× on the surface, over standard rigid coils.

In particular, chest coils for imaging children with congenital heart defects would be particularly well suited since the difference in size is much greater between age groups and the high SNR would allow much faster scans to occur, this extraordinarily important when imaging smaller children.

Fabrication of phased arrays of antennas (non-MRI) would be another application of the various embodiments due of their built in symmetry and pattern repetition. Traditional rigid coils are expensive instruments, and clinics cannot afford to stock coils for all patient sizes. By using the flexible printed coil array devices of the present embodiments for MRI phased arrays, cost-effective high-fidelity custom-fit hardware can be provided to a wide variety of patients.

Flexible arrays are well fitted to be used in pediatric patients since it would allow better coverage of more body types.

Adult knees, ankles, shoulders or other extremities would benefit from using the type coil arrays of the present embodiments.

Creation of MRI clothing with coils embedded or printed directly on the fabric to increase hospital throughput and patient comfort are envisioned as being within the scope of this disclosure.

The various embodiments provided herein advantageously help reduce the number of screens, stamps, dies, or other expensive printing hardware that may be needed other printing technologies or device fabrication technologies.

Reference is made to U.S. Pat. No. 9,696,393, which is incorporated by reference in its entirety, for additional and supplemental information regarding MRI receiver coils, fabrication processes and materials.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the embodiments (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosed embodiments and does not pose a limitation on the scope of the disclosure unless otherwise claimed. No language in the specification should be construed as indicating any non-claimed element as essential to the practice of the embodiments.

Exemplary embodiments are described herein. Variations of those exemplary embodiments may become apparent to those of ordinary skill in the art upon reading the foregoing description. The inventors expect skilled artisans to employ such variations as appropriate, and the inventors intend for the embodiments to be practiced otherwise than as specifically described herein. Accordingly, the scope of the disclosure includes all modifications and equivalents of the subject matter recited herein and in the claims appended hereto as permitted by applicable law. Moreover, any combination of the above-described elements in all possible variations thereof is encompassed by the disclosure unless otherwise indicated herein or otherwise clearly contradicted by context.

The invention claimed is:

1. A method of forming a flexible magnetic resonance imaging (MRI) receive coil device having at least one receive coil with at least one capacitor, the method comprising:
   a) providing a flexible substrate having a first surface and a second surface opposite the first surface;
   b) forming a first conductor pattern on the first surface by printing a first layer of conductive material on the first surface using a printing mask having a pattern; and
   c) forming a second conductor pattern on the second surface by printing a second layer of conductive material on the second surface using said printing mask,
   wherein a portion of the first conductor pattern on the first surface overlaps with a portion of the second conductor pattern on the second surface with the flexible substrate therebetween to form the at least one capacitor.

2. The method of claim 1, wherein the flexible substrate comprises a dielectric plastic material selected from the group consisting of a polyimide (PI) film, a polyethylene terephthalate (PET) film, a polyethylene naphthalate (PEN) film, a polyetherimide (PEI) film, a polytetrafluoroethylene (PTFE) film, and a poly ether ketone (PEEK) film.

3. The method of claim 1, wherein the receive coil device includes two or more capacitors, and wherein separated portions of the first conductor pattern on the first surface overlap with separated portions of the second conductor pattern on the second surface with the flexible substrate therebetween to form the two or more capacitors.

4. The method of claim 3, wherein the receive coil device includes four capacitors.

5. The method of claim 1, further including iteratively repeating steps b) and c) one or more times to form a flexible MRI receiver coil device having an array of two or more receive coils, wherein for each iteration, a position of the printing mask is adjusted relative to the flexible substrate so that each subsequent receive coil formed is offset relative to a previous receive coil formed.

6. The method of claim 1, wherein the conductive material comprises a conductive ink.

7. The method of claim 6, wherein the conductive ink includes a metal material selected from the group consisting of gold, copper and silver.

8. The method of claim 7, wherein the metal material comprises metallic flakes.

9. The method of claim 1, further including annealing the flexible substrate after each conductor pattern has been formed on the flexible substrate.

10. The method of claim 1, wherein printing includes screen printing and said mask includes a screen printing mask.

11. A method of forming a flexible magnetic resonance imaging (MRI) receive coil device having at least one receive coil with at least one capacitor, the method comprising:
   providing a flexible substrate having a first surface and a second surface opposite the first surface;
   providing a screen printing mask having a mask pattern;
   screen printing a first layer of conductive material on the first surface using said screen printing mask to form a first conductor pattern on the first surface; and
   screen printing a second layer of conductive material on the second surface using said screen printing mask to form a second conductor pattern on the second surface,
   wherein the mask pattern is arranged such that a portion of the first conductor pattern overlaps with a portion of the second conductor pattern with the flexible substrate therebetween to form the at least one capacitor.

* * * * *